United States Patent [19]

Isakozawa et al.

[11] Patent Number: 5,013,915
[45] Date of Patent: May 7, 1991

[54] TRANSMISSION TYPE ELECTRON MICROSCOPE

[75] Inventors: Shigeto Isakozawa; Toshiyuki Ohashi, both of Katsuta, Japan

[73] Assignee: Hitachi, Ltd., Tokyo, Japan

[21] Appl. No.: 298,886

[22] PCT Filed: May 20, 1988

[86] PCT No.: PCT/JP88/00482

§ 371 Date: Jan. 11, 1989

§ 102(e) Date: Jan. 11, 1989

[51] Int. Cl.[5] .............................................. H01J 37/26
[52] U.S. Cl. .................................................. 250/311
[58] Field of Search ........................ 250/311, 310, 306

[56] References Cited

U.S. PATENT DOCUMENTS 2,058,914 10/1936 Rüdenburg ........................ 250/311
2,356,963 4/1944 Young ................................ 250/311
3,835,246 9/1974 Muller et al. ..................... 350/311

FOREIGN PATENT DOCUMENTS 58-189950 5/1983 Japan .
62-41660 3/1987 Japan .

Primary Examiner—Bruce C. Anderson
Attorney, Agent, or Firm—Antonelli, Terry, Stout & Kraus

[57] ABSTRACT

The present invention relates to an electron microscope which is suited for observing an electron microscope image as a TV image. It is desirable to prevent extraneous matters from dropping onto electron-beam illuminants (3, 8) for a TV camera. In order to solve this problem, the electron-beam illuminant for a TV camera is disposed between a projection lens system (1) and a fluorescent substance (6) for observing the image so that it can be inserted into and removed from the optical axis of an electron beam.

11 Claims, 2 Drawing Sheets

TRANSMISSION TYPE ELECTRON MICROSCOPE

TECHNICAL FIELD

The present invention relates to a transmission electron microscope, and especially to a transmission type electron microscope which is suited for observing an electron microscope image as a TV image.

BACKGROUND ART

The transmission type electron microscope which enables the observation of an electron microscope image on a monitor CRT by using a TV camera fitted thereto is known (see Proceedings of the 43rd Annual Meeting of the Electron Microscopy Society of America, 1985; Proceedings of the XIth Congress on Electron Microscopy, Kyoto, 1986, etc.)

According to such a known transmission type electron microscope as mentioned above, a film for photographing the electron microscope image is disposed so that it can be inserted into and removed from an electron beam axis and so that it is positioned below a fluorescent screen for observing the electron microscope image. The fluorescent screen is so disposed that it can be inserted into and removed from the electron beam axis, and moreover, an electron-beam scintilator or illuminant for a TV camera, which is constructed of a fluorescent screen, is disposed below the film. When the fluorescent screen for observing the electron microscope image and the film for photographing the electron microscope image are removed from the electron beam axis, the electron microscope image is formed on the electron-beam illuminant. This projected electron microscope image is picked up by the TV camera and displayed on the monitor CRT.

As is seen from the above, the electron-beam illuminant for the TV camera is disposed below the fluorescent screen for observing the electron microscope image and the film for photographing the electron microscope image. Consequently, extraneous matters (chips, dust and the like), which happen to be produced when both the fluorescent screen and the film are inserted into and removed from the electron beam axis, drop onto the electron-beam illuminant and become a hindrance to observation of a TV image. Being located invariably in the same positions, in addition, these extraneous matters are deposited with the passage of time and thus increase steadily, and therefore said hindrance is increased with the passage of time.

Such a hindrance can be eliminated by cleaning the electron-beam illuminant for the TV camera. However, it is necessary to break the vacuum of the tube of the electron microscope for this cleaning, and accordingly much time and labor are needed therefor. Disclosure of Invention One object of the present invention is to furnish a transmission type electron microscope which is suited for observing an electron microscope image as a TV image.

Another object of the present invention is to furnish a transmission type electron microscope which is suited for preventing the drop of extraneous matters onto the electron-beam illuminant for a TV camera.

Still another object of the present invention is to furnish a transmission type electron microscope which is suited for increasing the brightness of an image formed on the electron-beam illuminant for a TV camera.

Yet another object of the present invention is to furnish a transmission type electron microscope which is suited for reducing the damage of a sample due to electron beams.

According to the present invention, a transmission type electron microscope is furnished which is equipped with a means to generate an electron beam; a means to irradiate a sample with the electron beam; a means to form at a predetermined position an image of the electron beam which is transmitted through said sample irradiated with the aforesaid electron beam; a means disposed at the predetermined position to transform said image of said electron beam into a visible image; an electron-beam illuminant; a means to position said electron-beam illuminant selectively at a first position whereat it is exposed to the aforesaid electron beam proceeding from the aforesaid electron beam image forming means to the aforesaid visible image transformation means, and at a second position whereat it gets out of the exposure, the aforesaid electron-beam illuminant transforming an electron beam image formed thereon into a light image when said electron-beam illuminant is positioned at the aforesaid first position; a TV camera to pick up the light image; and a means to display the image picked up.

BEST MODE FOR CARRYING OUT THE INVENTION

Figure 1:
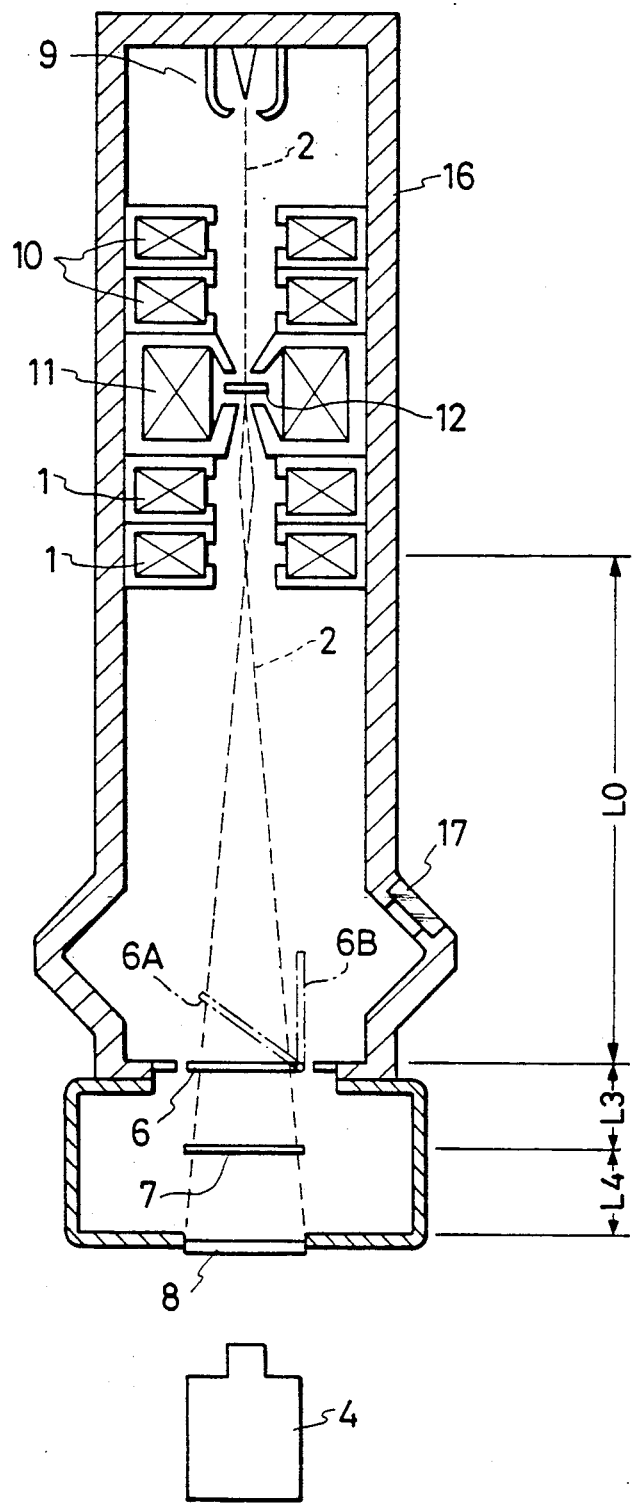
FIG. 1 is a schematic longitudinal sectional view of a transmission type electron microscope known already.

Prior to the description of an embodiment of the present invention, first the transmission electron microscope known already will be described with reference to FIG. 1. In FIG. 1, an electron beam 2 emitted from an electron gun 9 is converged by a condenser or convergent lens system 10 on a sample 12 disposed inside or in the vicinity of an objective lens 11. The electron beam 2 transmitted through the sample 12 is projected on a fluorescent screen 6 for observing an electron microscope image, by the objective lens 11 and a projection lens system 1, and said fluorescent screen transforms an electron beam image formed thereon into a visible image.

When the fluorescent screen 6 for observation is positioned at a position denoted by 6A, the visible image formed thereon can be observed through a transparent observation window 17 provided in the tube 16.

When the fluorescent screen 6 for observation is positioned at a position denoted by 6B, the electron beam 2 is projected on a film 7 for photographing the electron microscope image, and thereby the electron microscope image is photographed.

When the film 7 in addition to the fluorescent screen 6 for observation is removed from the position whereat it is exposed to the electron beam, the electron beam 2 is projected on an electron-beam scintilator or illuminant 8 for a TV camera. The electron-beam illuminant 8 transforms an electron beam image formed thereon into a light image, and the image obtained through the transformation is picked up by the TV camera and displayed on a monitor CRT not shown in the figure.

The electron-beam illuminant 8 is disposed below the fluorescent screen 6 for observing the image and the film 7 for photographing the image. Consequently, extraneous matters (chips, dust and the like), which happen to be produced when both the fluorescent plate and the film are inserted into and removed from the electron beam axis, drop onto the electron-beam illuminant 8 and become a hindrance to observation of a TV image. While these extraneous matters are located invariably in the same positions, in addition, they are deposited with the passage of time and thus increase steadily, and therefore said hindrance is increased with the passage of time.

Such a hindrance can be eliminated by cleaning the electron-beam illuminant for a TV camera. For this cleaning, however, it is necessary to break the vacuum of the tube of the electron microscope, and accordingly much time and labor are needed therefor.

Since the electron-beam illuminant 8 is disposed below the fluorescent screen 6 for observation, moreover, the brightness of the electron microscope image on the electron-beam illuminant 8 is lower than that of this image on the fluorescent screen 6 for observation, as will be described hereunder.

For a detailed description, a distance from the lens surface of the final-stage lens of the projection lens system 1 to the fluorescent screen 6 for observation is denoted by $L_O$, and a distance from said surface to a fluorescent plate for TV, i.e. the electron-beam illuminant 8, is denoted by $(L_O+L_3+L_4)$. Moreover, an electron beam density on the fluorescent screen 6 for observation is denoted by $I_1$, while a current density on the fluorescent screen for TV, i.e. the electron-beam illuminant 8, is denoted by $I_2$. Then, $$I_2/I_1 = L_0^2/(L_0+L_3+L_4)^2$$

$$I_2 = I_1 \cdot L_0^2/(L_0+L_3+L_4)^2$$

Accordingly, $I_2$ is smaller than $I_1$, and thus the image on the electron-beam illuminant 8 becomes less bright than that on the fluorescent screen 6 for observation. In order to obtain an image of the same brightness, therefore, the intensity of the electron beam 2 must be increased, which, in turn, results in an increase in damage of the sample 12 due to the irradiation with the electron beam.

Figure 2:
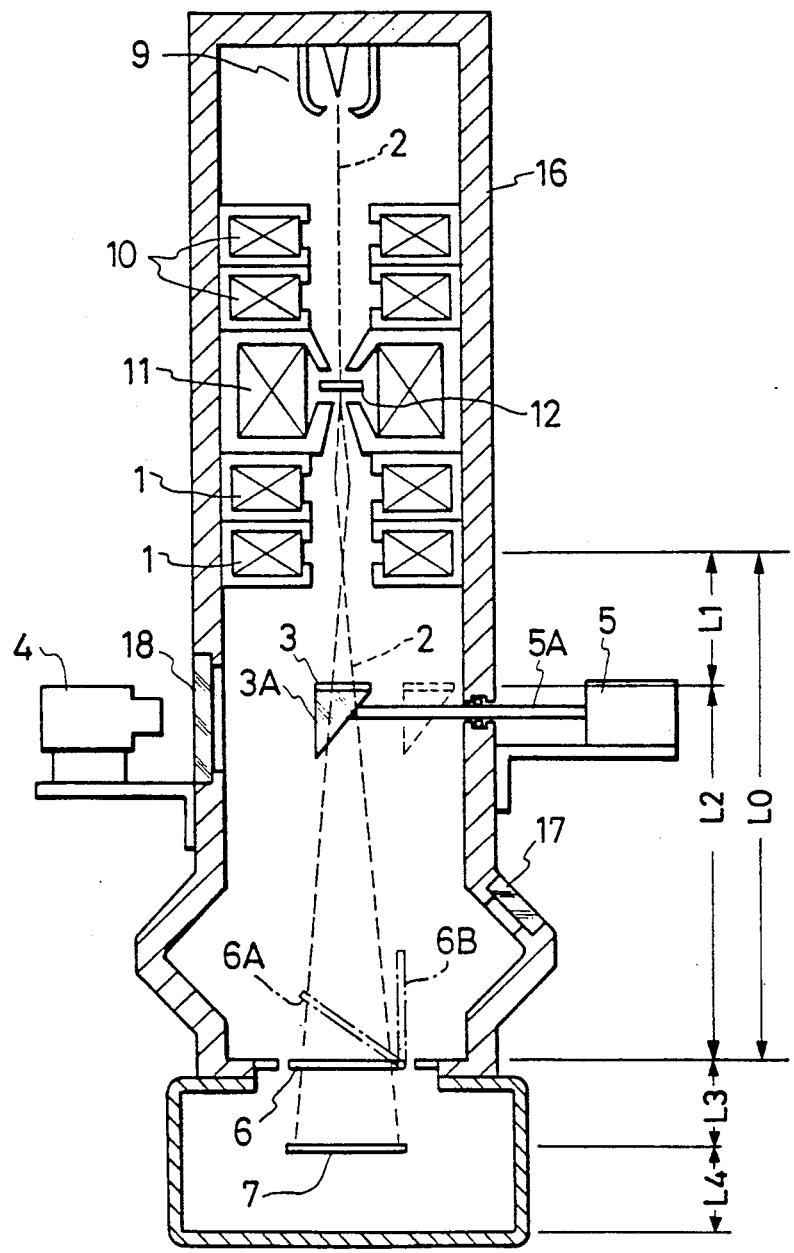
FIG. 2 is a longitudinal sectional view of one embodiment according to the present invention.

In FIG. 2, the same marks with those in FIG. 1 are put on parts which are the same as or equivalent to the ones in FIG. 1.

An electron beam 2 emitted from an electron gun 9 is converged by a convergent lens system 10 on a sample 12 disposed inside or in the vicinity of the lens magnetic field of an objective lens 11. The electron beam 2 transmitted through the sample 12 is projected on a fluorescent screen 6 for observing the electron microscope image, by the objective lens 11 and a projection lens system 1, and said fluorescent screen transforms an electron beam image formed thereon into a visible image. When the fluorescent screen 6 for observing the image is positioned at a position denoted by 6A, the visible image formed thereon can be observed through a transparent observation window 17 provided in a tube 16.

When the fluorescent screen 6 for observing the image is positioned at a position denoted by 6B, the electron beam 2 is projected on a film 7 for photographing the electron microscope image, and thereby the electron microscope image is photographed.

Between the projection lens system 1 and the fluorescent screen 6 for observing the image, a prism 3A is disposed in proximity to the projection lens system 1, and an electron-beam scintilator or illuminant 3 for a TV camera, which is formed of a fluorescent substance, is applied on a surface, i.e., on the upper surface, of the prism. The prism 3A is supported by a support arm 5A, and this support arm penetrates or pierces, in a vacuum-proof manner, the wall of the tube 16 the inside of which is kept in vacuum and is connected to a driving unit 5 which is fitted to the wall of the tube 16 outside thereof. This driving unit is provided for shifting the electron-beam illuminant 3, together with the prism 3A, between two positions, a first position whereat it is exposed to the electron beam 2 coming from the projection lens system 1, i.e. a position indicated by a solid line, and a second position whereat it gets out of the exposure, i.e. a position indicated by a dotted line. The unit may have a construction of a fluid drive type for rapid switching between the two positions.

When the electron-beam illuminant 3 is shifted to the first position, it is irradiated with the electron beam from the projection lens system 1, and the electron microscope image formed thereon is transformed into a light image. The light image obtained through this transformation is reflected by the slanting surface of the prism 3A and taken out of the lateral surface thereof. The light image thus taken out is picked up by a TV camera 4 fitted outside to the tube 16, through a transparent window 18 for the TV camera, and is displayed on a monitor CRT not shown in the figure.

The electron-beam illuminant 3 and the prism 3A need to be shifted, of course, to the second position in the case when the electron microscope image is observed on the fluorescent screen 6 or when it is photographed with the film 7.

As is apparent from the above description, the electron-beam illuminant 3 is disposed nearer to the projection lens system 1 than to the fluorescent screen 6 for observing the image and the film 7, in the upper position than the latter. Therefore, the dust produced through the operation of the fluorescent screen 6 for observing the image and of the film 7 is prevented from dropping and being deposited on the electron-beam illuminant 3, and thus a TV image of the electron microscope image free from damage or stain can be obtained.

A current density on the electron-beam illuminant 3 is expressed by the following equations when a distance from the lens surface of the final-stage lens of the projection lens system 1 to the electron-beam illuminant 3 is denoted by $L_1$, and a distance between the electron-beam illuminant 3 and the fluorescent screen 6 for observation by $L_2$, and when it is assumed that $L_1+L_2=L_0$.

$$I_3/I_1 = (L_1 + L_2)^2/L_1^2$$
$$= L_0^2/L_1^2$$
$$I_3 = I_1 \cdot L_0^2/L_1^2$$

Accordingly, $I_3$ is larger by $L_0^2/L_1^2$ times than $I_1$, and the image is brighter by this rate. Therefore, a bright TV image can be obtained while the damage of a sample due to irradiation with the electron beam is relieved.

The embodiment described above can be modified or altered in some ways by persons concerned without any deviation from the essence of the present invention, and therefore it is to be understood that the scope of the present invention should not be limited to the range of the above-described embodiment.

What is claimed is:

1. A transmission type electron microscope, comprising:
   means for generating an electron beam;
   means for irradiating a sample with the electron beam so as to transmit the electron beam through the sample;
   means for projecting the transmitted electron beam onto a predetermined plane to form an image of the transmitted electron beam on the predetermined plane;
   a fluorescent screen disposed on the predetermined plane for converting the image of the transmitted electron beam into a visible image;
   an electron beam illuminant removably disposed at a first position between the electron beam projecting means and the fluorescent screen so as to be exposed to the transmitted electron beam, thereby producing a light image of the transmitted electron beam;
   means for receiving and displaying the light image of the transmitted electron beam whereby the light image is produced before the transmitted electron beam reaches the predetermined plane;
   means for shifting the electron beam illuminant from the first position to a second position at which the electron beam illuminant is prevented from being exposed to the transmitted electron beam.

2. A transmission type electron microscope according to claim 1, wherein the light image receiving and displaying means comprises a TV camera.

3. A transmission type electron microscope according to claim 2, wherein the first position is nearer to the electron beam projecting means than to the fluorescent screen.

4. A transmission type electron microscope according to claim 2, wherein the electron beam illuminant is provided with a fluorescent surface substantially perpendicular to the axis of the electron beam when being exposed thereto.

5. A transmission type electron microscope according to claim 4, further comprising a surface for reflecting the light image produced by the electron beam illuminant to the TV camera.

6. A transmission type electron microscope according to claim 5, wherein the first position is closer to the electron beam projecting means than to the fluorescent screen.

7. A transmission type electron microscope according to claim 2, further comprising a prism, the prism being provided with a fluorescent surface for producing the light image which is substantially perpendicular to the axis of the electron beam when being exposed thereto and a slanting surface for reflecting the light image to the TV camera, and a support means for supporting the prism, the electron beam illuminant shifting means driving the support means to selectively locate the fluorescent surface at the first position and the second position.

8. A transmission type electron microscope according to claim 7, further comprising a tube, the inside of which is kept in a vacuum, in which the electron beam is directed from the electron beam generating means to the fluorescent screen.

9. A transmission type electron microscope according to claim 8, wherein the support means pierces the tube in a vacuum-proof manner and the electron beam illuminant shifting means is mounted to the tube so that the electron beam illuminant shifting means is located outside of the tube.

10. A transmission type electron microscope according to claim 9, further comprising a first transparent window provided in the tube, the TV camera being mounted to the tube so as to be located outside the first transparent window.

11. A transmission type electron microscope according to claim 10, further comprising a second transparent window for observing the visible image on the fluorescent screen.

* * * * *